United States Patent [19]
Tabarelli et al.

[11] Patent Number: 4,509,852
[45] Date of Patent: Apr. 9, 1985

[54] APPARATUS FOR THE PHOTOLITHOGRAPHIC MANUFACTURE OF INTEGRATED CIRCUIT ELEMENTS

[76] Inventors: Werner Tabarelli, Schlosstr. 5, Vaduz, Liechtenstein, FL-9490; Ernst W. Löbach, Tonagass 374, Eschen, Liechtenstein, FL-9492

[21] Appl. No.: 408,727

[22] Filed: Aug. 17, 1982

Related U.S. Application Data

[62] Division of Ser. No. 194,422, Oct. 6, 1980, Pat. No. 4,346,164.

[51] Int. Cl.³ .............................................. G03B 27/52
[52] U.S. Cl. ........................................ 355/30; 355/75
[58] Field of Search ................... 355/75, 76, 27, 30; 352/5; 354/195

[56] References Cited

U.S. PATENT DOCUMENTS

| | | | |
|---|---|---|---|
| 2,073,287 | 3/1937 | Sandvik | 352/5 X |
| 3,115,815 | 12/1963 | Friedel | 355/27 X |
| 3,614,223 | 10/1971 | Ott | 355/30 |
| 3,648,587 | 3/1972 | Stevens | 354/195 |
| 3,893,763 | 7/1975 | Ott | 355/30 X |

*Primary Examiner*—Richard A. Wintercorn
*Attorney, Agent, or Firm*—Karl F. Ross; Herbert Dubno

[57] ABSTRACT

Using a photolithographic projection apparatus a mask having a pattern is imaged on a photosensitive layer coating a semiconductor substrate by a projection lens. To improve the resolving capability and to obviate adverse effects, e.g. standing waves and inhomogeneous exposure, the space between the substrate and the adjacent boundary face of a projection lens is filled during exposure with a transparent liquid having the same refractive index as the photosensitive layer.

4 Claims, 5 Drawing Figures

APPARATUS FOR THE PHOTOLITHOGRAPHIC MANUFACTURE OF INTEGRATED CIRCUIT ELEMENTS

CROSS REFERENCE TO RELATED APPLICATION

This application is a division of our copending application Ser. No. 194,422 filed Oct. 6, 1980, now U.S. Pat. No. 4,346,164 issued Aug. 24, 1982.

BACKGROUND OF THE INVENTION

In the manufacture of integrated circuits structuring in the vertical direction of the semiconductor substrate has, due to the modern doping techniques and highly advanced methods for the deposition of layers on semiconductor surfaces, developed to such an extent that the possibilities of structuring in the horizontal direction have been left far behind. Intensive efforts are, therefore, made to scale down the structure of integrated circuits in the lateral dimensions of the semiconductor disk. To this end, a change from whole-disk exposure to step-by-step exposure of identical circuits on a semiconductor disc is taking place. Parallel developments are seeking alternatives to optical lithography on which all methods for the manufacture of integrated circuits presently in use are based. Such alternatives are electron beam lithography and X-ray lithography in particular. Electron beam lithography has already been practically applied in the manufacture of masks. The direct treatment of semiconductor disks with electron beams is very complicated, however, and the costs are far too high in view of the low output. Moreover, experiences gathered in photolithography, e.g. in respect to the use of certain photosensitive layers, are no longer applicable in such basically new methods. X-ray lithography is in a very early experimental state, and its development is hindered by the lack of sufficiently intense X-ray sources as well as by the low efficiency of these sources and by complicated masking techniques.

Practical progress is most likely to be made by improving optical lithography, whereby local changes in the molecular structure of the photosensitive layer are obtained by local exposure of the layer. Hence, efforts are made to increase the resolving capability by employing so-called "deep" ultraviolet light (about 270 nm), which means that the limits drawn by diffraction effects are shifted. Operations in this wavelength range involve the troublesome work of developing conventional optical components, i.e. lenses, filters as well as photosensitive resists into components which are effective. A further disadvantage results from the fact that alignment operations, which are one of the main problems of all industrial lithographic methods, are most advantageously carried out by means of visible light. When ultraviolet is used as the exposure light, alignment operations either have to be carried out with visible light causing inaccuracies or inconveniences of troublesome difficult operations with UV-detectors.

It is possible, in principle, to improve the resolving capability of a lens by increasing the opening angle. This possibility is, however, limited by the structure of the projection lens and, above all, by a problem which is characteristic of the lithography of structured surfaces. This problem is the vignetting, i.e. the shading of parts of the image-forming rays by projecting parts of the semiconductor surface. Due to this effect, the opening angle in photolithographic devices lies necessarily below the amount which total reflection would occur at the boundary surface of the planar substrate. Consequently, measures for eliminating total reflection in order to increase the opening angle have not heretofore been taken into consideration.

SUMMARY OF THE INVENTION

The present invention is based on the consideration that a measure which is usually only considered from the aspect of eliminating total reflection, i.e. the use of an immersion liquid, can successfully be employed in lithography in spite of the necessity of limiting the opening angle. This is due to the fact that the resolving capability of the projection lens increases with the numerical aperture (NA), the numerical aperture being given by the relation $NA = n = \sin\theta$ (n refractive index, $\theta$ = half of the opening angle or opening half-angle). Hence, the introduction of an immersion liquid increases the resolving capability by increasing the refractive index.

When, as provided in accordance with the present invention, the space between the disk and the boundary face of the projection lens directed towards the disk is filled with transparent liquid during exposure the specific advantage of the lithography of structured surfaces is obtained, i.e. the resolving capability can be maintained in spite of smaller angles of incidence, and the danger of vignetting can be diminished at the same numerical aperture. In a sense, the use of an immersion liquid creates the same effect as aimed at by the use of ultraviolet light, i.e. by using shorter wavelengths the resolving capability limited by diffraction effects is improved without leaving the range of visible light or moving far therefrom as, in accordance with the present invention, the change of the wavelength is not effected by changing the frequency but by changing the refractive index. The importance of the invention in the manufacture of integrated circuits is still increased by the fact that it is possible to take the characterictics of the photosensitive resists, particularly the refractive index, into account, when choosing the immersion liquid provided in accordance with the present invention.

The homogeneous exposure of the entire image field is one of the major problems, when exposing photosensitive resists on semiconductor disks, particularly in the manufacture of fine structures. A non-uniformity of about 1% is a good standard value. The uniform illumination of the image field is required but by no means sufficient for reaching the desired purpose. This would only be the case if the surface of the semiconductor disk were homogeneous with the photosensitive resist applied thereto. This will, however, no longer be the case after the first lithographic step as the first desired structures have now already been produced. During the various steps of manufacturing integrated circuits there are generally numerous steps, raised and lowered area, slopes etc. on the semiconductor surface. The inhomogeneity of the surface is not only related to the topography but also to the different composition and crystal structure of individual regions on the surface. Only the varying reflecting power of these regions, which is influenced by their different structures, is of interest in this connection.

When a layer of photosensitive resist is applied to such a surface, this layer is never of uniform thickness. After drying it, the profile of the surface of the photosensitive resist follows the profile of the boundary face photosensitive resist—substrate only to a limited extent.

When light impinges on such a photosensitive resist, the following physical phenomena appear: The impinging light is partly reflected at the boundary face air—photosensitive resist and partly refracted. The refracted portion penetrates the photosensitive resist and contributes to exposure (as far as it is light of the exposure wavelength). In case of grazing incidence, e.g. on steep slopes of the surface of the photosensitive resist, the reflected portion is highly increased.

The penetrating light decays in accordance with the attenuation coefficient of the photosensitive resist. The light being more or less attenuated impinges on the boundary face photosensitive resist substrate and is partly absorbed, partly reflected by this boundary face.

Said reflected portion moves again towards the boundary face photosensitive resist—air, thereby being attenuated, it is partly reflected at this boundary face and transmitted partly refracted. Even total reflection occurs in some places.

The light waves reciprocating within the photosensitive resist interfere and form standing waves. These standing waves contribute substantially to the exposure of the photosensitive resist. The intensity of the standing waves depends to a large extent on the local thickness of the photosensitive resist. The formation of standing waves is attenuated, when a remarkable absorption occurs within the photosensitive resist or at the boundary face photosensitive resist—substrate. This situation does generally not occur, however.

The high reflection in case of grazing incidence at slopes and the different intensity of standing waves due to the varying thickness of the photosensitive resist are mainly responsible for the fact that an inhomogeneous exposure of photosensitive resists on structured semiconductor disks occurs in spite of uniform illumination. This inhomogeneous illumination is the reason for a variation of the line width of line-shaped structures to be produced from the layer of photosensitive resist. The stronger the above-mentioned effects the higher the requirements to the image contrast, i.e. the so-called MTF-values (modulation transfer function) must be great in order to obtain a sharp image. Conversely, if there are no interfering effects smaller MTF-values can also be processed, i.e. in case of a set numerical aperture finer lines can be imaged.

Prior art methods for eliminating the aforementioned interfering effects are not satisfactory. Attempts to reduce the variations of the thickness of the photosensitive resist and to use photosensitive resists with high self-absorption have the disadvantage of long exposure times.

When, however, in accordance with the preferred embodiment of the invention, the disk coated with a layer of photosensitive resist is immersed in an immersion liquid whose refractive index is similar to the refractive index of the photosensitive resist the boundary face photosensitive resist—air or now photosensitive resist-immersion liquid totally dissolve under the optical point of view. Hence, the above-discussed interfering effects are entirely eliminated. As a result, finer lines can be imaged at the same numerical aperture.

The immersion liquid should preferably have a refractive index which is close to that of the photosensitive resist ($n = 1.6$), the absorption coefficient of the liquid on the working wavelengths should be negligible. The immersion liquid must naturally be of such a kind that it does not impair the photosensitive resist, i.e. it must not dissolve the photosensitive resist or create any chemically adverse effects. This requirement must also be fulfilled under the influence of light radiation. The liquid itself must not decompose under the influence of radiation and should be inert in respect of the structural materials employed. In order to be able to fill minute spaces on the surface of the photosensitive resist the immersion liquid should have a wetting effect on the photosensitive resist. Loose particles are washed away and can, therefore, not create a magnifying effect. In spite of good wetting the immersion liquid must be easily removable from the surface of the photosensitive resist in order to ensure a processing without problems. A limited receptivity of water is of advantage as water droplets, which cannot be entirely avoided, are thus dissolved and become optically ineffective. Low viscosity facilitates the escape of gas bubbles, which have the same optical effect as dust particles, and, furthermore, it ensures a quick filtering of the immersion liquid.

The easiest way of continuously controlling the state of the immersion liquid is to use a device comprising a chuck retaining the semiconductor disk during the exposure cycle and forming the bottom of a basin, the immersion liquid slowly circulating through said basin. Hence, it is possible to obtain a constant liquid supply and, moreover, to continuously remove impurities by means of filtering as well as to use the immersion liquid to maintain a constant temperature of the semiconductor disk. The solution of the last-indicated task is of great importance as it is of no use to improve the accuracy of the optical image to get into the submicron range without preventing at the same time that the semiconductor disk moves relative to the impinging rays under the influence of thermal fluctuations.

BRIEF DESCRIPTION OF THE DRAWING

In the following the invention will be described in greater detail with reference to the accompanying drawing in which.

SPECIFIC DESCRIPTION

Figures 1A, 1B:
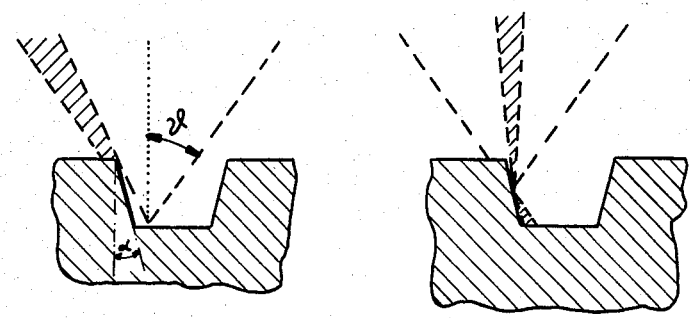
FIGS. 1a and b show in sectional views in the region of the surface of the semiconductor disk the limitation of the opening angle.

As illustrated in FIG. 1a, an incident pencil of rays is prevented from reaching points lying in a lowered area of the surface of a semiconductor disk, for example, if the slope leading to the lowered area is steeper than the light incidence, i.e. if $\alpha < \theta$. As can be seen in FIG. 1b, interfering effects occur already when the incident rays still impinge on the slope leading to the lowered area but when they are almost parallel thereto. Such grazing incidence causes underexposure of the slope region and, correspondingly, overexposure of the bottom of the lowered area due to reflected rays.

Figure 2:
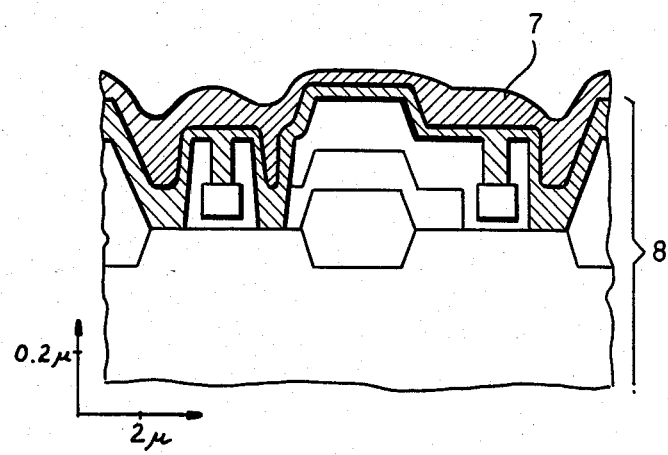
FIG. 2 shows by means of cross-section of the semiconductor the problem of variations of the thickness of the photosensitive resist.

FIG. 2, which shows a sectional view of the surface structure of a semiconductor disk after a number of exposure cycles, clearly illustrates that the limitation of the opening angle in order to eliminate vignetting effects is an essential object of semiconductor lithography.

As can also be seen in FIG. 2, the photosensitive resist 7 on the disk 8 shows substantial variations in thickness. This is due to the fact that the liquid photosensitive resist, after being applied, forms a planar surface irrespective of the underlying structure. After being dried, said surface of the photsensitive resist follows the substrate surface substantially but not precisely, which is caused by the escape of the solvent. Lowered areas of the surface are covered by a substantially higher layer of photosensitive resist than raised areas of the surface.

The variations in the thickness of the photosensitive resist have considerable consequences as it depends on the thickness of the photosensitive resist whether the standing waves formed in the photosensitive resist are amplified or attenuated by interference. The theory on which this phenomenon is based has been discussed in the following literature:

J. D. Cuthbert, Solid State Technology, August 1977, page 59;

Dietrich W. Widmann, Applied Optics, April 1975, Vol. 14, No. 4, page 932;

Dietrich W. Widmann and Hans Binder, IEEE Transactions on Electron Devices, Vol. ED-22, No. 7, July 1975, pages 467–469.

In the most unfavorable circumstances, variations in the thickness of the photosensitive resist can cause a local variation in the illumination level in spite of homogeneous exposure, said local variation causing a prolongation of the exposure time by the factor 2.5 for the less exposed regions. The differences in the the photosensitivity of the individual surface regions, which are due to the variations in the thickness of the photosensitive resist, make higher demands on the image contrast, i.e. the possibility of imaging finer lines is reduced. This adverse effect is more aggravating than the afore-mentioned prolongation of the exposure time.

Figure 3:
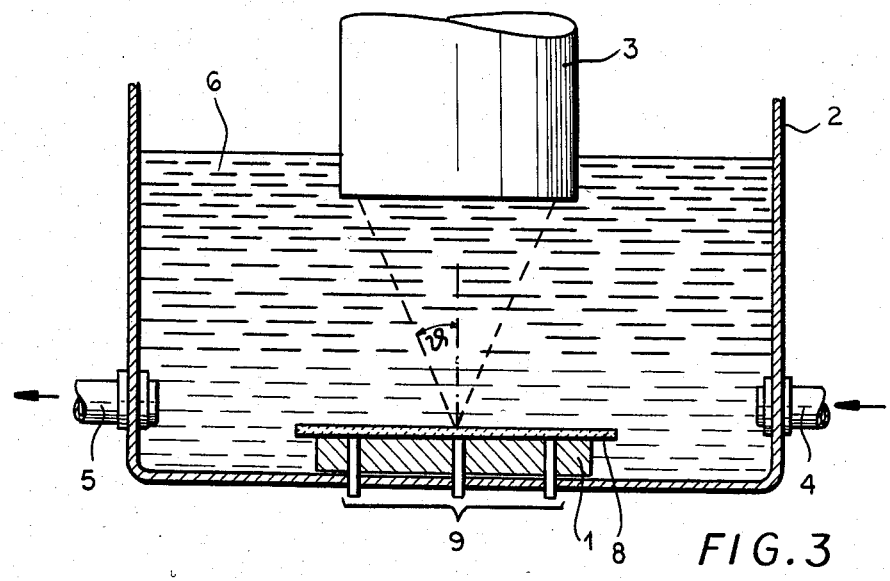
FIG. 3 shows the principle of the present invention by means of a schematic sectional view of projection lens and semiconductor disk.

As already mentioned, and schematically illustrated in FIG. 3, the above-indicated disadvantages can be eliminated by immersing the semiconductor disk 8 to be exposed as well as the projection len 3 into a liquid 6 during exposure. In the following a number of liquids applicable within the scope of the present invention as well as their refractive indices substantially corresponding to the refractive index of photosensitive resist ($n=1.6$) will be indicated:

benzene: $n=1.50$
monobromobenzene: $n=1.56$
1-bromo-2-iodobenzene: $n=1.66$
dimethylnaphthylene: $n=1.61$
ethylnaphthylene: $n=1.60$
2.3-dimethylaniline: $n=1.57$
2-phenylethylamine: $n=1.53$
isopropyloxybenzene: $n=1.50$
monobromonaphthylene: $n=1.66$ All above-indicated liquids have a wetting effect on the photosensitive resist. They lie close to the surface of the photosensitive resist, whereby impurities are washed away and become optically ineffective. The second group of liquids have the advantage that they are able to dissolve minute drops of water so that they have no longer the effect of spherical lenses.

As already discussed, when employing the immersion liquid 6, the numerical aperture of the arrangement is automatically increased in accordance with the refractive index of the liquid, thus increasing the resolving capability. It is further possible to dimension the opening angle in a range limited by the phenomenon of vignetting, as the image error of an immersion lens is minor than the error of a dry system at a certain opening angle. The elimination of effects occuring at the surface of the photosensitive resist in the dry system ensures image formation at a substantially reduced image contrast and, hence, a further reduction of the transferrable line width. A further effect which is not related to the optical device and to the pattern imaged by said device and whose importance should not be underrated will be discussed in the following:

Although the exposure of the semiconductor disks is prepared under conditions corresponding to those of a surgical operation it is almost impossible to keep the disks entirely free from dust, when placing them below the exposure device. In view of the fineness of the produced structures even a normal particle of dust may render the produced circuit unservicable. Methods which are applied at present have a high rejection rate in spite of the fact that is has been tried to remove residual dust particles immediately before exposure by blowing them off. A further problem is caused by the difficulties in keeping the temperature in the exposure region as constant as possible, whereby fluctuations exceeding 1° C. create absolutely adverse effects.

Figure 4:
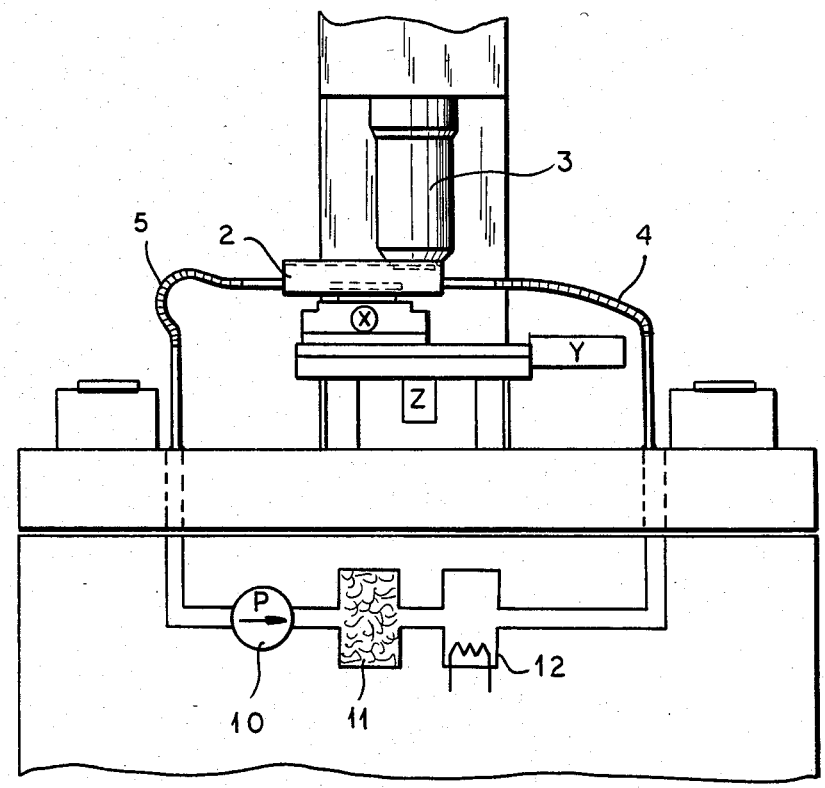
FIG. 4 shows a side view of the entire exposure device to give an idea of the actual arrangement of the device in accordance with the invention.

In the device illustrated in FIGS. 3 and 4, the cleaning as well as the temperature stabilization of the semiconductor disk 4 are a natural result of the basic idea of the present invention. The liquid 6 cleans the semiconductor disk 8 retained on the support 1 by means of vacuum lines 9 and keeps the temperature of the disk constant, feeding pipes 4 and discharge pipes 5 leading to the container 2 create constant conditions. Said feeding- and discharge pipes, which are flexible and allow the displacement in the directions X and Y required for the step-by-step exposure as well as the alignment in the Z-direction, belong to a cycle comprising a reservoir, which has not been illustrated, a pump 10, a filter 11 and means 12 effecting a temperature increase or decrease depending on the measured temperature.

What is claimed is:

1. An apparatus for the photolithographic printing of a pattern onto a semiconductor substrate, comprising:
   a substantially horizontal support for said semiconductor substrate;
   means for horizontally moving said support in mutually orthogonal X and Y directions for step-by-step exposure of successive portions of said semiconductor substrate;
   a projection lens disposed above said support and said semiconductor substrate for imaging a pattern of a mask upon each of the successive portions of said semiconductor substrate to activate a photosensitive layer thereon, as said portions are aligned with said lens by the movement of said support in said X and Y directions;
   a basin carried by and movable with said support, receiving said semiconductor substrate and having an upper rim lying above at least a lower face of said lens whereby said lower face projects into said basin; and
   flexible pipe mens for feeding a transparent liquid having a refractive index close to that of said layer into said basin, for removing said liquid from said basin and for maintaining the level of liquid in said basin always above said lower face for imaging of said pattern upon said successive portions under constant conditions of filling of the space between said layer and said face with said liquid, said liquid being capable of wetting said layer and substantially incapable of attacking same.

2. The apparatus defined in claim 1 wherein said flexible pipe means includes a flexible feed pipe and a flexible discharge pipe for said transparent liquid, said pipes opening into said basin below the level of said face.

3. The apparatus defined in claim 2 wherein said feed pipe and said discharge pipe are connected in a closed circulating path for said liquid, said path including a filter for cleaning the circulated liquid.

4. The apparatus defined in claim 3 wherein said path further includes means for maintaining said liquid at a constant temperature.

* * * * *

Dedication 4,509,852.—*Werner Tabarelli*, Vaduz, Liechtenstein, *Ernst W. Lobach*, Eschen, Liechtenstein. APPARATUS FOR THE PHOTOLITHOGRAPHIC MANUFACTURE OF INTEGRATED CIRCUIT ELEMENTS. Patent dated Apr. 9, 1985. Dedication filed Feb. 20, 1990, by the assignee, Mercotrust Aktiengesellschaft.

Hereby dedicates to the Public the remaining term of said patent.
[ *Official Gazette April 17, 1990* ]